US 6,751,137 B2

(12) United States Patent
Park et al.

(10) Patent No.: US 6,751,137 B2
(45) Date of Patent: Jun. 15, 2004

(54) COLUMN REPAIR CIRCUIT IN FERROELECTRIC MEMORY

(75) Inventors: Je Hoon Park, Kyonggi-do (KR); Hee Bok Kang, Daejeon-shi (KR); Hun Woo Kye, Kyonggi-do (KR); Duck Ju Kim, Cheju-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/237,205

(22) Filed: Sep. 9, 2002

(65) Prior Publication Data

US 2003/0053328 A1 Mar. 20, 2003

(30) Foreign Application Priority Data

Sep. 20, 2001 (KR) ...................................... P2001-58279

(51) Int. Cl.[7] ................................................. G11C 7/00
(52) U.S. Cl. ..................... 365/200; 365/225.7; 365/145
(58) Field of Search ................................. 365/200, 145, 365/225.7

(56) References Cited

U.S. PATENT DOCUMENTS

| | | | |
|---|---|---|---|
| 5,751,627 A | 5/1998 | Ooishi | 365/145 |
| 5,808,943 A | 9/1998 | Sato et al. | 365/200 |
| 6,078,534 A | 6/2000 | Pfefferl et al. | 365/200 |
| 6,157,585 A | 12/2000 | Kim | 365/200 |
| 6,175,528 B1 | 1/2001 | Kye | 365/200 |
| 6,178,125 B1 * | 1/2001 | Niiro | 365/200 |
| 6,246,616 B1 * | 6/2001 | Nagai et al. | 365/200 |
| 6,317,355 B1 * | 11/2001 | Kang | 365/145 |

* cited by examiner

Primary Examiner—Michael S. Lebentritt
Assistant Examiner—Tuan T. Nguyen
(74) Attorney, Agent, or Firm—Morgan, Lewis & Bockius LLP

(57) ABSTRACT

A column repair circuit in a non-volatile ferroelectric memory having main columns and redundancy columns includes a data input/output buffer part for data input/output between the non-volatile ferroelectric memory and an external circuit, a failed column coding part for controlling the main columns and the redundancy columns and connected in response to a failed column address signal to one of main input/output lines in the input/output buffer part and redundancy input/output lines, a repair column adjusting circuit part connected to the failed column coding part for providing a redundancy mode control signal, a data bus amplifying part for amplifying data between the main input/output lines and the main columns to control read/write operation, and a redundancy data bus amplifying part for amplifying data between the redundancy input/output lines and the redundancy columns in response to the redundancy mode control signal.

20 Claims, 17 Drawing Sheets

P: electric field
E: polarity

Master fuse "Cut"

COLUMN REPAIR CIRCUIT IN FERROELECTRIC MEMORY

The present invention claims the benefit of the Korean Patent Application No. P2001-58279 filed in Korea on Sep. 20, 2001, which is hereby incorporated by reference.

BACKGROUND OF THE INVENTION

1. Field of the Invention

The present invention relates to a non-volatile ferroelectric memory, and more particularly, to a column repair circuit in a non-volatile ferroelectric memory having column redundancy.

2. Background of the Related Art

In general, a nonvolatile ferroelectric memory device such as a ferroelectric random access memory (FRAM), for example, has a data processing speed equivalent to that of dynamic random access memory (DRAM), and the nonvolatile ferroelectric memory device retains data during a power OFF state.

The FRAM and DRAM are memory devices with similar structures, but the FRAM includes a ferroelectric capacitor having high residual polarization characteristics. The residual polarization characteristics permit the retention of data when an applied electric field is removed.

FIG. 1 illustrates a characteristic curve of a hysteresis loop of a ferroelectric material according to the related art. In FIG. 1, even if polarization induced by the electric field has the electric field removed, data is maintained at a certain amount (i.e., d and a states) without being erased due to the presence of residual polarization (or spontaneous polarization). The 'd' and 'a' states correspond to '1' and '0', respectively.

FIG. 2 illustrates a unit cell of a non-volatile ferroelectric memory according to the related art. In FIG. 2, the unit cell is provided with a bitline B/L formed along one direction, a wordline W/L formed perpendicular to the bitline, a plateline P/L formed spaced from the wordline along a direction identical to the wordline, a transistor T1 having a gate connected to the wordline and a source connected to the bitline B/L, and a ferroelectric capacitor FC1 having a first terminal connected to a drain of the transistor T1 and a second terminal connected to the plateline P/L.

The data input/output operation of the related art non-volatile ferroelectric memory will be explained. FIG. 3A illustrates a timing diagram of a write mode operation of a ferroelectric memory according to the related art, and FIG. 3B illustrates a timing diagram of a read mode operation of the non-volatile ferroelectric memory.

During a writing mode, an external chip enable signal CSBpad transits from a 'high' level to a 'low' level and, at the same time, an external write enable signal WEBpad transits from a 'high' level to a 'low' level. When address decoding is started in the write mode, a pulse applied to the wordline transits from a 'low' level to a 'high' level to select a specific cell. Accordingly, the wordline is held at a 'high' level, the plateline has a 'high' level signal applied thereto for one period and a 'low' level signal applied thereto for another period in sequence. In order to write a logical value '1' or '0' to the selected cell, a 'high' or 'low' level signal synchronized to the write enable signal WEBpad is applied to the bitline. Moreover, if a 'high' level signal is applied to the bitline and a signal applied to the plateline is at a 'low' level in a period, then a signal applied to the wordline is at a 'high' level state, thereby a logical value '1' is written to the ferroelectric capacitor. If a 'low' level signal is applied to the bitline, and a signal applied to the plateline is at a 'high' level, then a logical value '0' is written to the ferroelectric capacitor.

The operation for reading the data stored in the cell by the foregoing write mode operation will be explained.

If the chip enable signal CSBpad is transited from a 'high' level to a 'low' level from outside of the cell, all bitlines are equalized to a 'low' level voltage by an equalizer signal before the wordline is selected. Then, after the bitlines are disabled, an address is decoded, and the decoded address transits the wordline from a 'low' level to a 'high' level, to select the cell. A 'high' level signal is applied to the plateline of the selected cell to break a data corresponding to a logical value '1' stored in the ferroelectric memory. If a logical value '0' is stored in the ferroelectric memory, then a data corresponding to the logical value '0' is not broken. The data not broken, and the data broken thus provide values different from each other according to the aforementioned hysteresis loop, so that the sense amplifier senses a logical value '1' or '0'. That is, when the data broken is a case when the value is changed from 'd' to 'f' in the hysteresis loop in FIG. 1, and the case of the data not broken is a case when the value is changed from 'a' to 'f' in the hysteresis loop in FIG. 1. Therefore, if the sense amplifier is enabled after a certain time period is passed, in the case of the data broken, a logical value '1' is provided as amplified, and in the case of the data not broken, a logical value '0' is provided as amplified. After the sense amplifier amplifies and provides the data, since an original data should be restored, the plateline is disabled from a 'high' level to a 'low' level during a state in which a 'high' level signal is applied to the wordline.

FIG. 4 illustrates a block diagram of a non-volatile ferroelectric memory according to the related art. In FIG. 4, the non-volatile ferroelectric memory is provided with a main cell array part 41 having a lower part allocated for a reference cell array part 42, a wordline driver part 43 on one side of the main cell array part 41 for applying a driving signal to the main cell array part 41 and the reference cell array part 42, and a sense amplifier part 44 under the main cell array part 41. The wordline driver part 43 provides a driving signal to a main wordline in the main cell array part 41, and a reference wordline in the reference cell array part 42. The sense amplifier part 44 has a plurality of sense amplifiers each for amplifying a signal received from the bitline or the bitbarline.

The operation of the non-volatile ferroelectric memory will be explained, with reference to FIG. 5. FIG. 5 illustrates a detail of FIG. 4, wherein the main cell array has a folded bitline structure like a DRAM. In FIG. 5, the reference cell array part 42 has a folded bitline structure, and a reference cell wordline and a reference cell plateline formed in a pair. The reference cell wordline and the reference cell plateline pairs are defined as RWL__1/RPL__1, and RWL__2/RPL__2. When a main cell wordline MWL__N−1 and a main cell plateline MPL__N−1 are enabled, the reference cell wordline RWL__1 and the reference cell plateline RPL__1 are enabled, to load a main cell data on the bitline, and a reference cell data on the bitbarline BB/L. When a main cell wordline MWL__N and a main cell plateline MPL__N are enabled, the reference cell wordline RWL__2 and the reference cell plateline RPL__2 are enabled, to load a main cell data on the bitbarline BB/L, and a reference cell data on the bitline B/L. A bitline voltage REF from the reference cell is between B H (High) and B L (Low), both are bitline voltages from the main cell. Therefore, in order to have the reference voltage REF to be between B__H and B__L, the reference cell may be operated by either of two methods.

A first method is storing a logical "1" in a capacitor in the reference cell by forming a size of the reference cell capacitor to be smaller than a size of a main cell capacitor. A second method is storing a logical "0" in a capacitor in the reference cell by forming a size of the reference cell capacitor to be greater than a size of a main cell capacitor. Thus, the non-volatile ferroelectric memory provides the reference voltage the sense amplifier requires 44 by using the two methods.

FIG. 6 illustrates a sense amplifier according to the related art included in the sense amplifier part in FIG. 4. In FIG. 6, the sense amplifier is an inverter of a latch type, inclusive of two PMOS transistors, and two NMOS transistors. A first PMOS transistor MP1 and a second PMOS transistor MP2 are arranged opposite to each other, with an output terminal of the first PMOS transistor connected to a gate of the second PMOS transistor MP2, and an output terminal of the second PMOS transistor MP2 connected to a gate of the first PMOS transistor MP1. Input terminals of the first, and second PMOS transistors MP1 and MP2 have a SAP signal applied thereto in common. The SAP signal is an enable signal for enabling the first, and second PMOS transistors MP1 and MP2. An output terminal of the first PMOS transistor MP1 is connected to the first NMOS transistor MN1 in series, and an output terminal of the second PMOS transistor MP2 is connected to the second NMOS transistor MN2 in series. An output terminal of the second NMOS transistor MN2 is connected to a gate of the first NMOS transistor MN1, and an output terminal of the first NMOS transistor MN1 is connected to a gate of the second NMOS transistor MN2. The input terminals of the first and second NMOS transistors MN1 and MN2 have an SAN signal applied thereto in common. The SAN signal is a signal for enabling the first or second NMOS transistor MN1 or MN2. Output terminals of the first PMOS transistor MP1 and the first NMOS transistor MN1 are connected to the bitline B_N in common, and output terminals of the second PMOS transistor MP2 and the second NMOS transistor MN2 are connected to a next bitline B_N+1. Thus, the sense amplifier with outputs connected to the bitlines B_N, and B_N+1 input/output to/from the main cell and the reference cell. Therefore, during a precharge period when the sense amplifier is disabled, all the SAP, SAN, B_N, and B_N+1 signals are in ½ Vcc states. Opposite to this, when the sense amplifier is enabled, the SAP signal is pulled-up to a high level, and the SAN signal is pulled-down to a ground voltage level.

However, the non-volatile ferroelectric memory has the following problems. First, provision of a repair circuit for each memory cell requires a large area of the repair circuits. Second, the large repair circuit area is not suitable for high density device packing. Third, structure, and algorithm of the repair circuit are complicated, and the repairing operation delays operation.

SUMMARY OF THE INVENTION

Accordingly, the present invention is directed to a column repair circuit in a non-volatile ferroelectric memory that substantially obviates one or more of the problems due to limitations and disadvantages of the related art.

An object of the present invention is to provide a column repair circuit in a non-volatile ferroelectric memory, which is favorable for high density device packing.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a column repair circuit in a non-volatile ferroelectric memory having main columns and redundancy columns includes a data input/output buffer part for data input/output between the non-volatile ferroelectric memory and an external circuit, a failed column coding part for controlling the main columns and the redundancy columns and connected in response to a failed column address signal to one of main input/output lines in the input/output buffer part and redundancy input/output lines, a repair column adjusting circuit part connected to the failed column coding part for providing a redundancy mode control signal, a data bus amplifying part for amplifying data between the main input/output lines and the main columns to control read/write operation, and a redundancy data bus amplifying part for amplifying data between the redundancy input/output lines and the redundancy columns in response to the redundancy mode control signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Systems of 256M_2T2C, and 256M_1T1C FeRAM cells will be explained before starting explanation of the present invention. The 256M_2T2C FeRAM has four main cells in a top part thereof, and four reference cells in a bottom part thereof. On the other hand, the 256M_1T1C FeRAM has two main cells in a top part thereof, and two reference cells in a bottom part thereof. Each of the main cells has 512 wordlines WL, 128 bitlines perpendicular to the wordline WL, and two redundancy bitlines. The bitlines, and the redundancy bitlines are connected to a data bus, and a redundancy data bus through particular y-decoders selected by column addresses, respectively.

Figure 1:
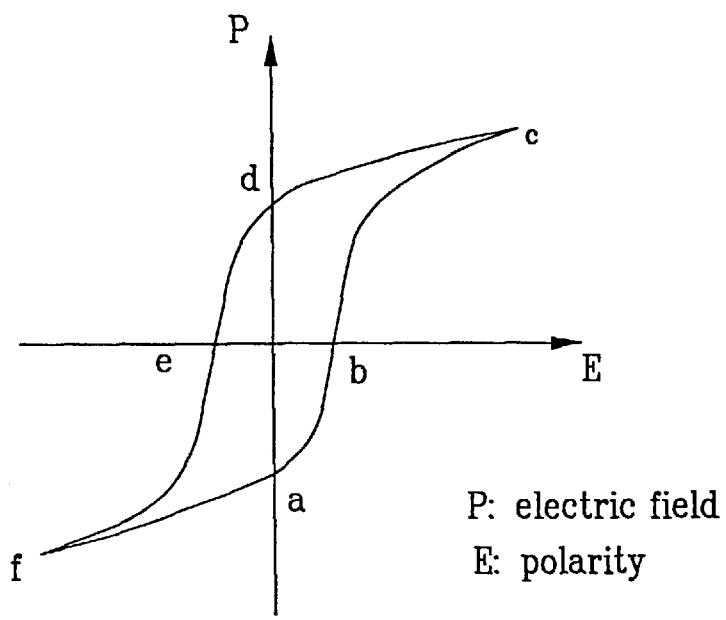
FIG. 1 illustrates a characteristic curve of a hysteresis loop of a general ferroelectric material according to the related art.
Figure 2:
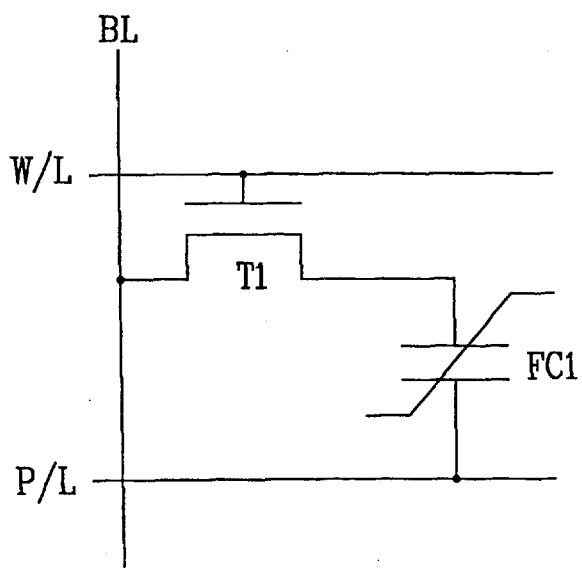
FIG. 2 illustrates a unit cell of a non-volatile ferroelectric memory according to the related art.
Figure 3A:
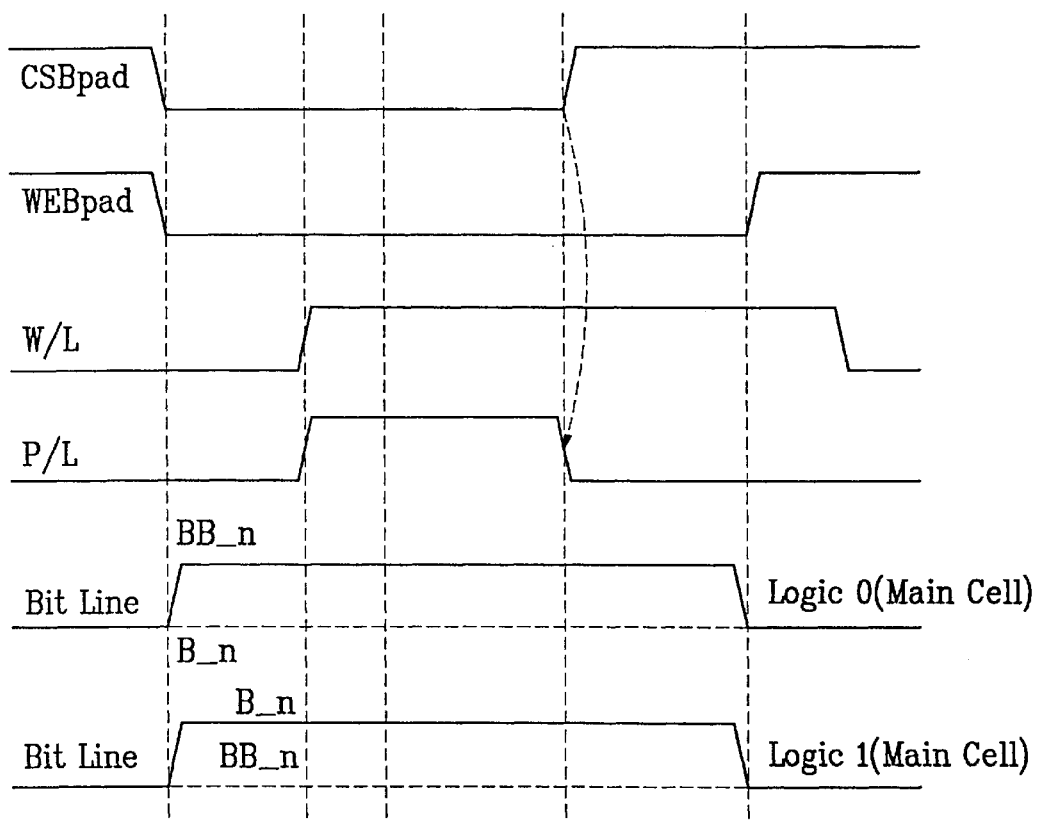
FIG. 3A illustrates a timing diagram of a write mode operation of a non-volatile ferroelectric memory according to the related art.
Figure 3B:
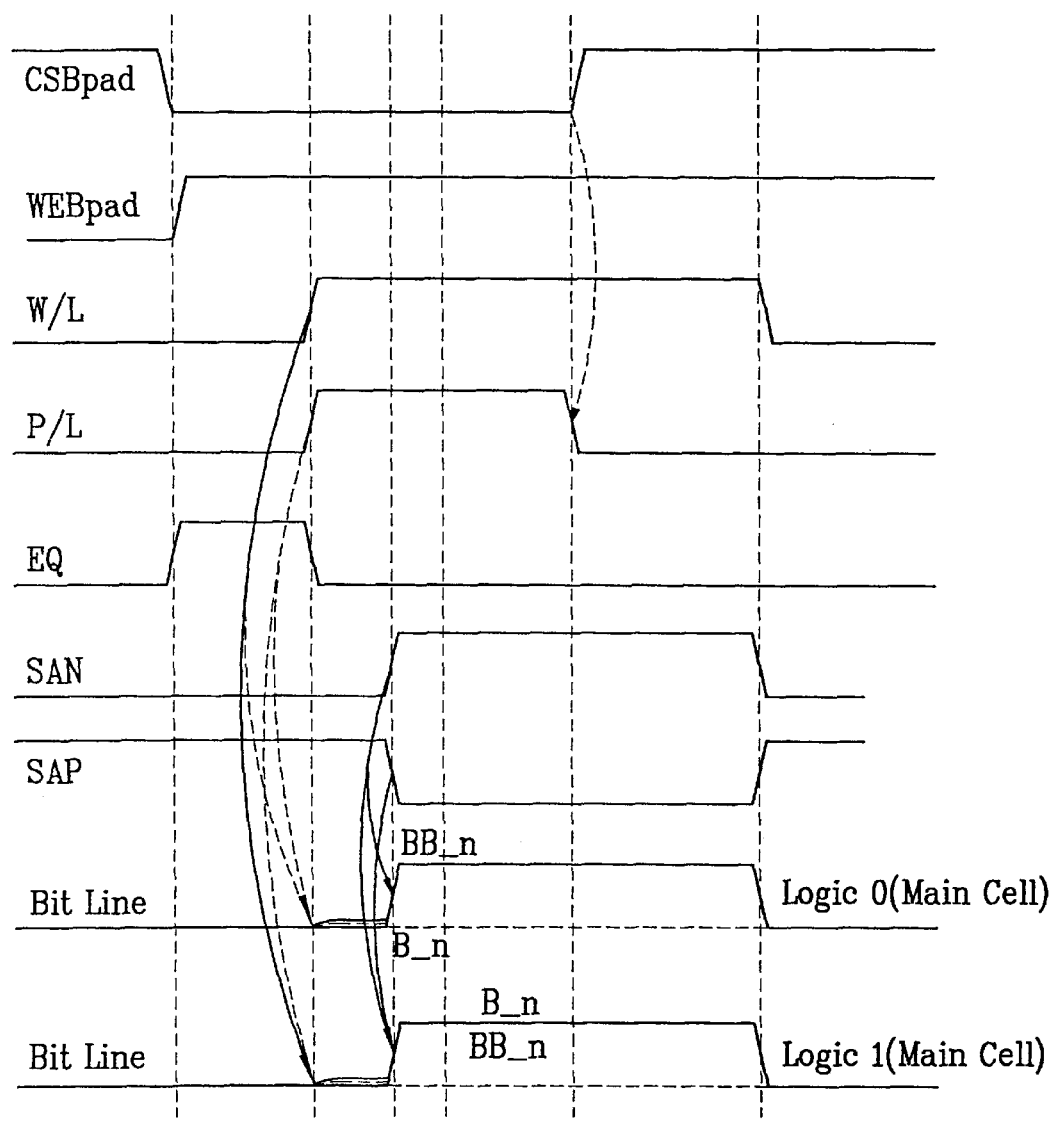
FIG. 3B illustrates a timing diagram of a read mode operation of a non-volatile ferroelectric memory according to the related art.
Figure 4:
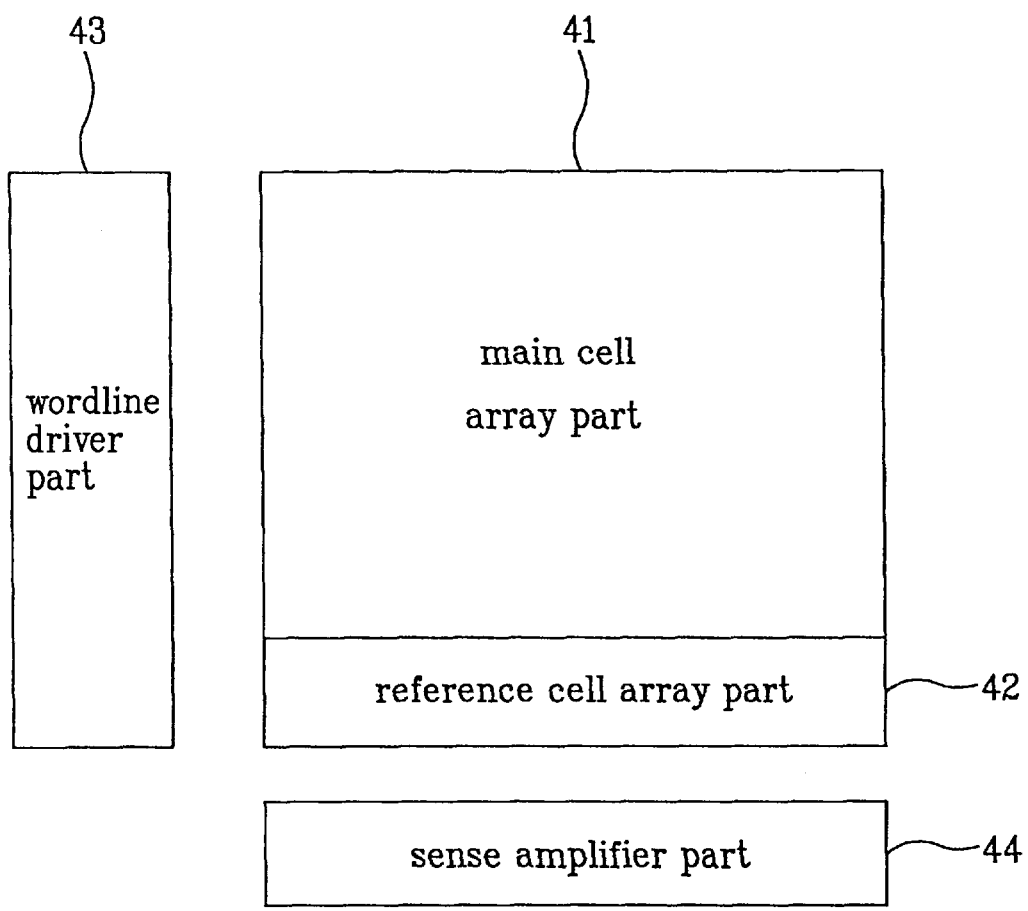
FIG. 4 illustrates a block diagram of a non-volatile ferroelectric memory according to the related art.
Figure 5:
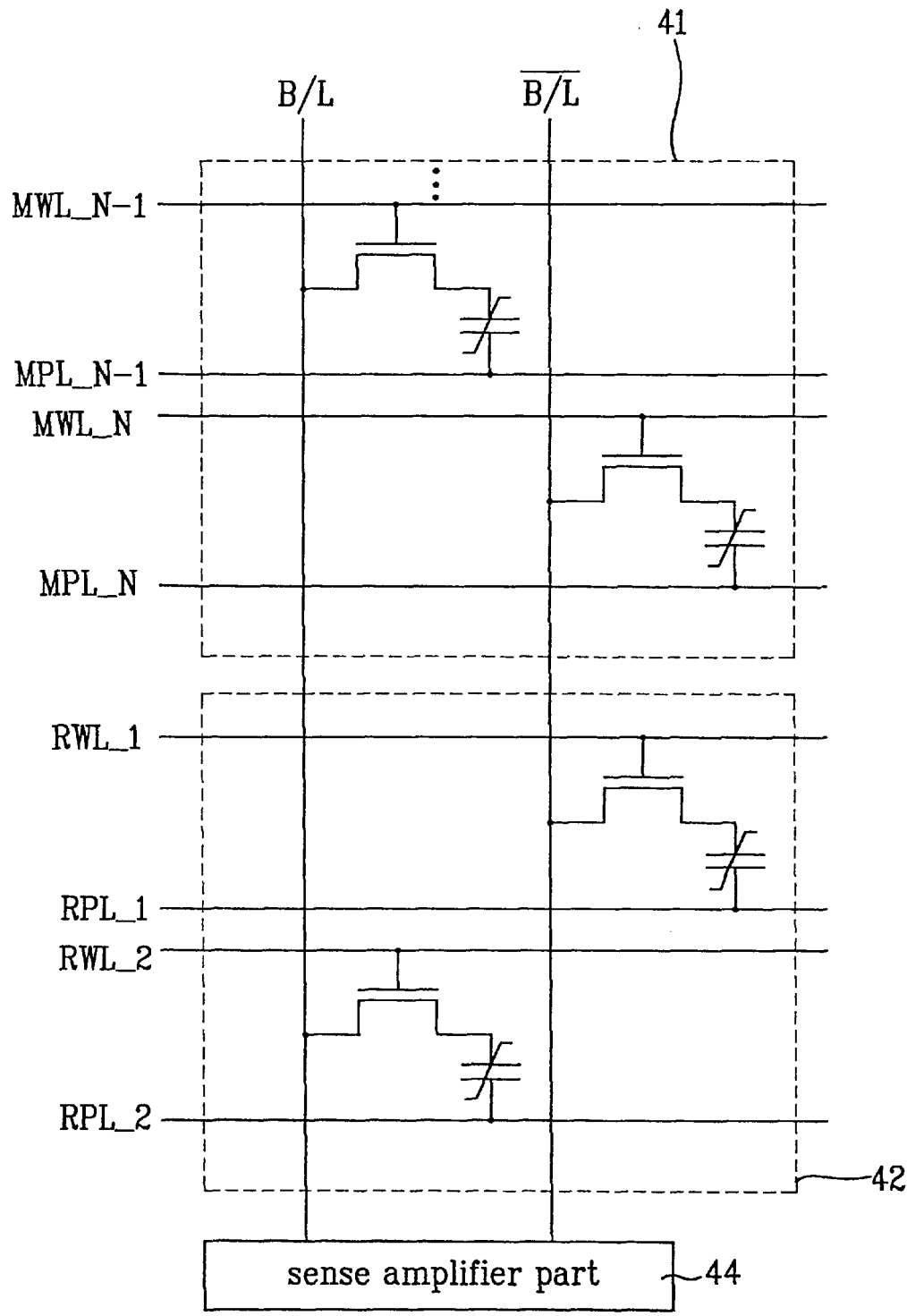
FIG. 5 illustrates a main cell array part of FIG. 4 according to the related art.
Figure 6:
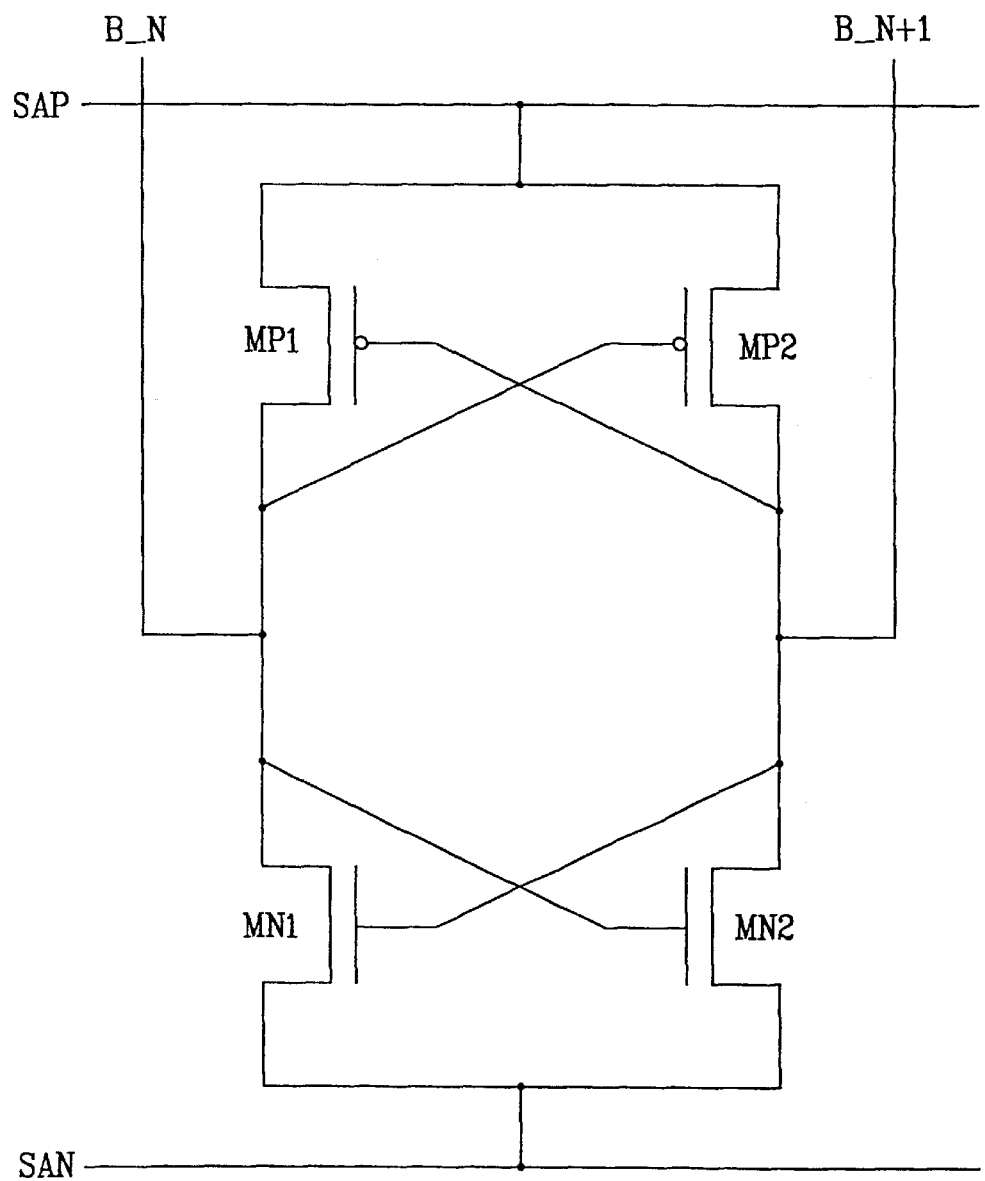
FIG. 6 illustrates a sense amplifier included in the sense amplifier part in FIG. 4 according to the related art.
Figure 7:
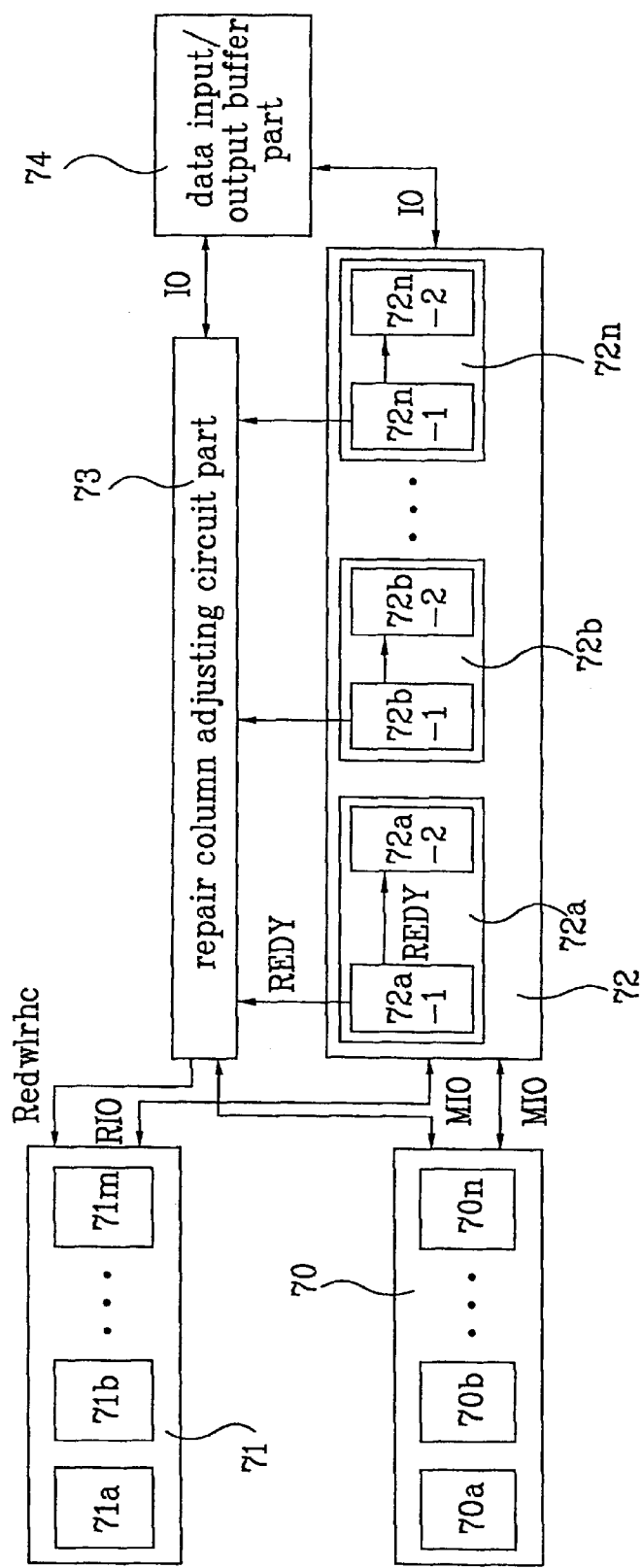
FIG. 7 schematically illustrates an exemplary column repair circuit in a non-volatile ferroelectric memory in accordance with the present invention.

FIG. 7 schematically illustrates a column repair circuit in a non-volatile ferroelectric memory in accordance with the present invention. In FIG. 7, the column repair circuit may include a data bus amplifying part 70, a redundancy data bus amplifying part 71, a fail column coding part 72, a repair column adjusting circuit part 73, and a data input/output buffer part 74.

The data bus amplifying part 70 may include a plurality of data bus amplifying blocks 70a, 70b, . . . , 70n, each for sensing and amplifying signals exchanged between input/output lines IO of the data input/output buffer part 74 and the data bus lines. The redundancy data bus amplifying part 71 may include a plurality of redundancy data bus amplifying blocks 71a, 71b, . . . , 71m, each for sensing and amplifying signals exchanged between fail column address input/output lines IO and redundancy data bus lines. The fail column coding part 72 may include a plurality of fail column coding fuse blocks 72a, . . . ,72n. An i$^{th}$ fail column coding fuse block 72 may include a fail column address fuse box 72i-1, and a fail input/output coding fuse box 72i-2. The fail column address fuse box 72i-1 may provide a fail column address enable signal REDY upon reception of an address of a failed column. The fail input/output coding fuse box 72i-2 may form a pair with the fail column address fuse box 72i-1 to selectively connect the input/output lines IO in the data input/output buffer part 74 to main input/output lines MIO connected to the data bus amplifying part 70, or to redundancy input/output lines RIO connected to the redundancy data bus amplifying part 71 in response to the fail column address enabling signal REDY from the fail column address coding fuse box 72i-1.

The repair column adjusting circuit part 73 may receive the fail column address enabling signal REDY from each fail column address fuse box, and connect the input/output lines MIO of the data bus amplifying part 70 to the input/output lines IO of the data input/output buffer part 74 when no failed column exists. The repair column adjusting circuit part 73 may provide a redundancy mode control signal Redwlrhc for enabling the redundancy data bus amplifying block of the redundancy data bus amplifying part 71 when a failed column is detected.

Figure 8:
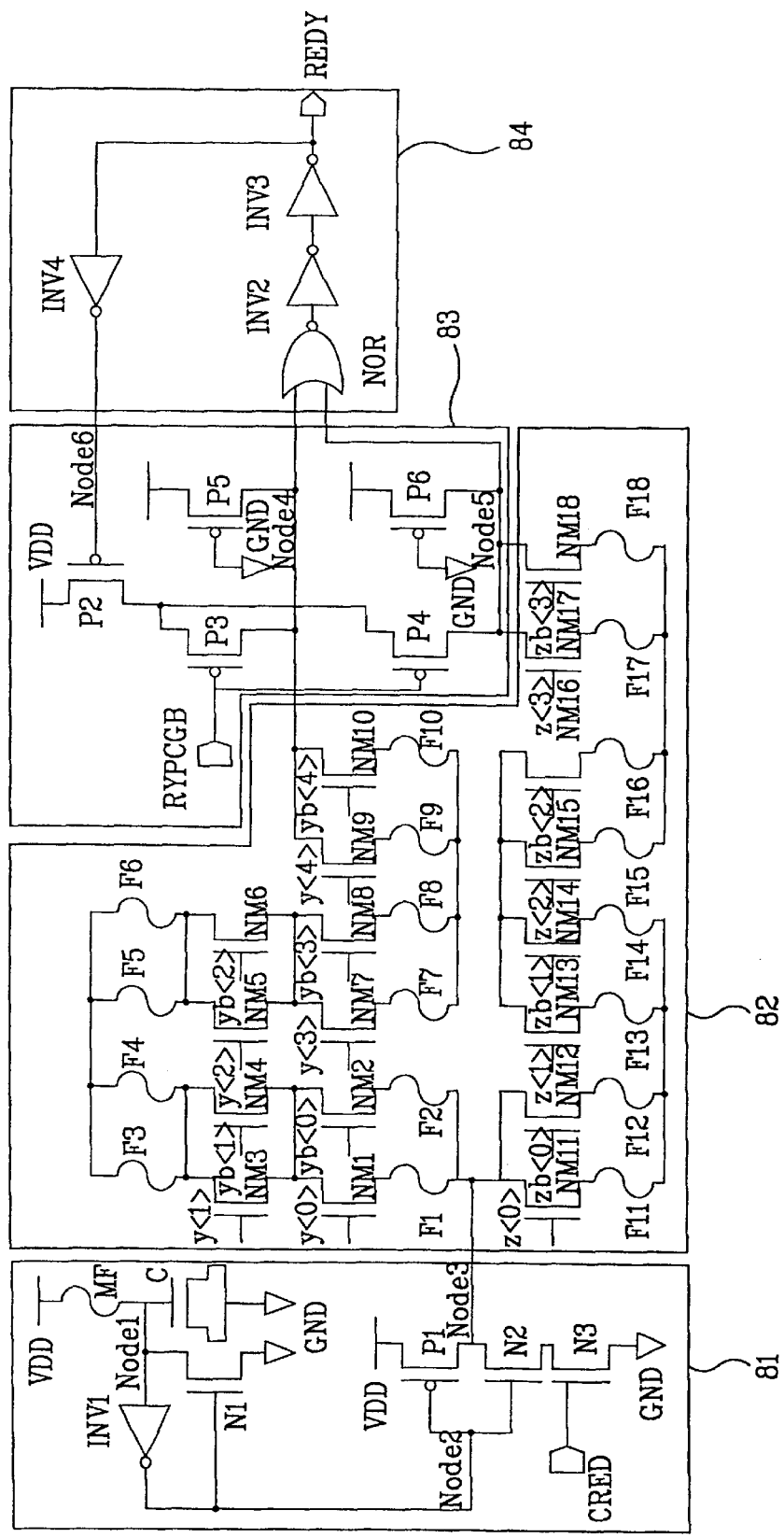
FIG. 8 illustrates an exemplary fail column address fuse box according to the present invention.

A system of the fail column address fuse box 72a-1 will be explained, with reference to FIG. 8. In FIG. 8, the fail column address fuse box 72a-1 may include a repair enabling signal control part 81, an address fuse cut coding block part 82, an address providing part 83, and an address sensing part 84. The fail column address fuse box 72a-1 may include 19 fuses in total, wherein a fuse in the repair enabling signal control part 81 may include a master fuse MF for determining repair of a column having a failure occurred therein. The 18 fuses in the address fuse cut coding block part 82 may be selectively servered according to a received column address.

In detail, the repair enabling signal control part 81 may include a master fuse MF, an NMOS capacitor C, an inverter INV1, NMOS transistors N1, N2, and N3, and a PMOS transistor P1. The master fuse MF may have one end connected to a VDD, and a node 1, the another end may be connected to one end of the NMOS capacitor C. The NMOS transistor N1 may be connected between the node 1 and a ground terminal GND. The inverter INV1 may invert a signal from the node 1, provide the inverted signal to a node 2 and to a gate terminal of the NMOS transistor N1. The PMOS transistor P1, and the NMOS transistors N2, and N3 may be connected in series between the VDD and the ground terminal GND, and gate terminals of the PMOS transistor P1, and the NMOS transistor N2 may be connected to the gate terminal. The gate terminal of the NMOS transistor N3 may have a redundancy control signal CRED applied thereto. The redundancy control signal CRED may disable the fail column address fuse box during standby. The repair enabling signal control part 81 may provide a signal denoting a repair operation through a node 3 between the PMOS transistor P1 and the NMOS transistor N2.

The address fuse cut coding block part 82 may include a plurality of unit address fuse cut coding blocks each having one NMOS transistor and one fuse connected in series. The units of one NMOS transistor and one fuse connected in series are in pairs. Each NMOS transistor NM3, . . . , NM118, . . . , NMn may have an address selection signal y<0>, yb<0>, . . . , y<3>, yb<3>, . . . , y<n>, yb<n>, and z<0>, zb<0>, . . . z<3>, zb<3>, . . . z<n>, zb<n> applied thereto, with signals of opposite phases applied to the units in a pair, respectively. Ends of the NMOS transistors and fuses connected in series in one pair may be connected, respectively.

In more detail, the address fuse cut coding block part 82 may include a circuit block for determining a 'y' address of a failed column, and a circuit block for determining a 'z' address of the failed column. The circuit block for determining a 'y' address of a fail column may include connected in succession in pairs starting from the node 3, which is an output terminal of the repair enabling signal control part 81, fuses F1 and F2, NMOS transistors NM1 and NM2, NMOS transistors NM3 and NM4, fuses F3 and F4, fuses F5 and F6, NMOS transistors NM5 and NM6, NMOS transistors NM7 and NM8, fuses F7 and F8, fuses F9 and F10, and NMOS transistors NM9 and NM10. One ends of the NMOS transistors NM9 and NM10 may be connected to the node 4 in common, for providing a 'y' address of a column to be repaired.

The circuit block for determining a 'z' address of the failed column has a system similar to the circuit block for determining a 'y' address of the failed column, inclusive of eight NMOS transistors NM11 to NM118, and eight fuses F11 to F18, corresponding to z<0>, zb<0>, . . . , z<3>, zb<3>. One ends of the NMOS transistors NM11 and NM12 may be connected to the node 3, and one ends of the NMOS transistors NM17, and NM18 may be connected to node 5, for providing a 'z' address of a column to be repaired.

The address providing part 83 may include PMOS transistors P2 to P6. One end of the PMOS transistor P2 may be connected to VDD, the PMOS transistor P3 may be connected between another end of the PMOS transistor P2 and the node 4, and the PMOS transistor P4 may be connected between the another end of the PMOS transistor P2 and the node 5. A gate terminal of the second PMOS transistor P2 may be connected to the node 6 for having an inverted failed column address enabling signal REDY from the address sensing part 84 applied thereto, and gate terminals of the PMOS transistor P3 and P4 may have an RYPCGB signal applied thereto.

Figure 9:
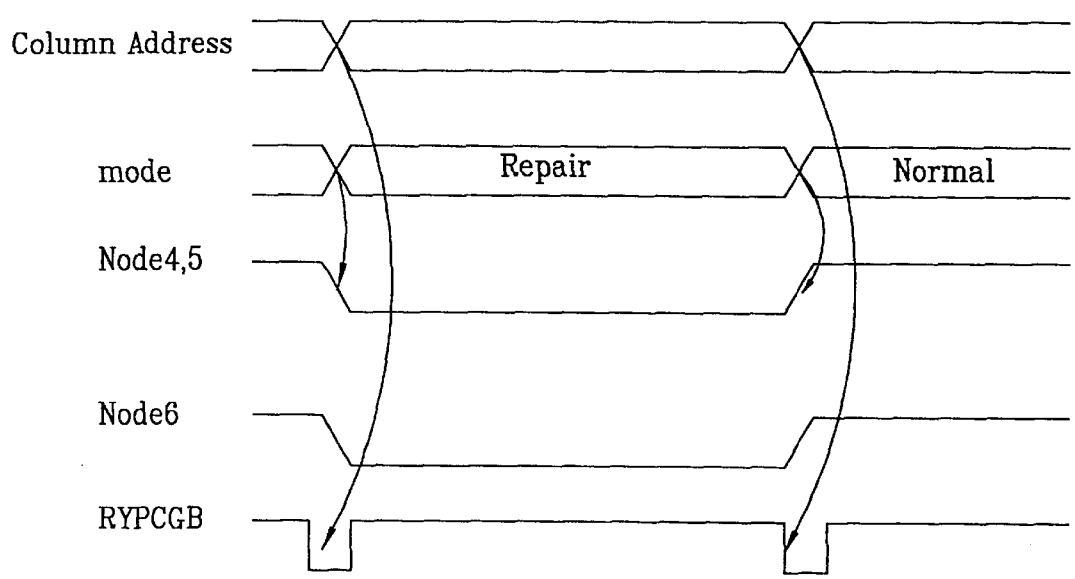
FIG. 9 illustrates an exemplary timing diagram during operation of a fail column address fuse box according to the present invention.

FIG. 9 illustrates an exemplary timing diagram during operation of a fail column address fuse box according to the present invention. In FIG. 9, the RYPCGB signal is at an "H" level regardless of repair during one cycle of column address, dropped to an "L" level for a short pulse when a new address cycle starts, and rises to the "H" level again. Accordingly, even if the failed column address enabling signal REDY is at a high level when a normal operation starts after a repair operation, a normal operation is possible because the RYPCGB signal turns ON the third, and fourth PMOS transistors P3, and P4, to place the nodes 4, and 5 at a high level. The PMOS P5 and PMOS P6 are connected to the VDD terminal and a point between nodes 4 and 5, respectively, and gate terminals thereof are connected to a ground terminal GND to remain in an ON state and to secure the "H" levels of the nodes 4 and 5 when the levels of the nodes 4 and 5 are not in an "H" level due to an influence from threshold voltages of the NMOS transistors that receive 'y' and 'z' addresses of the failed column when no repair is performed.

Figure 10:
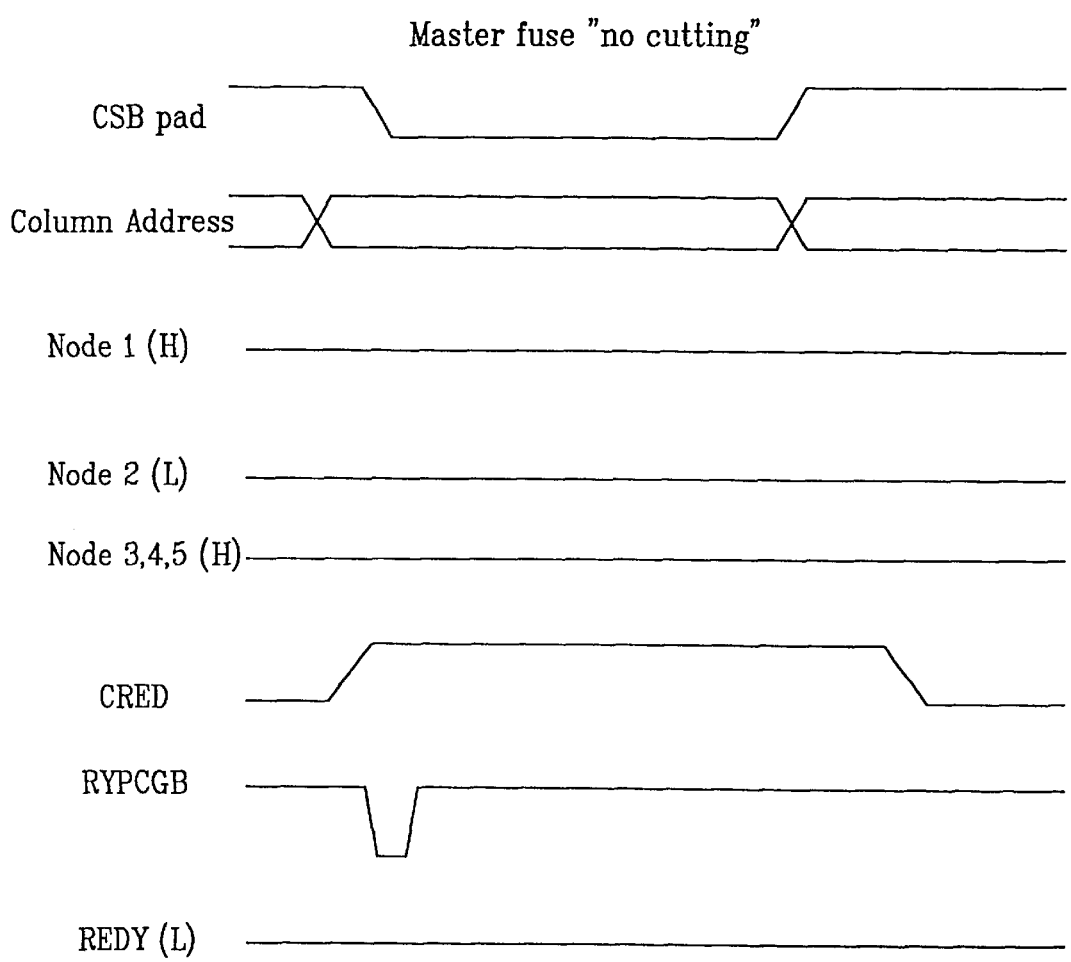
FIG. 10 illustrates an exemplary timing diagram when no repair is performed according to the present invention.

The address sensing part 84 may include a NOR gate NOR for subjecting signals on nodes 4 and 5 to logical sum and inversion, inverters INV2 and INV3 for delaying an output from the NOR gate NOR to provide the failed column address enabling signal REDY, and an inverter INV4 for inverting the failed column address enabling signal REDY and for forwarding the inverted failed column address enabling signal REDY to a gate terminal of the PMOS transistor P2 in the address providing part 83. If no failed column address is provided from the failed column address fuse box, i.e., when no repair is performed, the master fuse MF may not be severed, as shown in FIG. 10. Accordingly, when a chip enable signal CSBpad is enabled from a high level H to a low level L because the redundancy control signal CRED transits from a low level L to a high level H to start operation of the circuit, which transits the node 1 and node 2 to a high level H and a low level L, respectively, and node 3 is at a high level H by the low level L of the node 2, thereby transiting the nodes 4 and 5 to a high level H, the failed column address enabling signal REDY is transited to a low level L.

Figure 11:
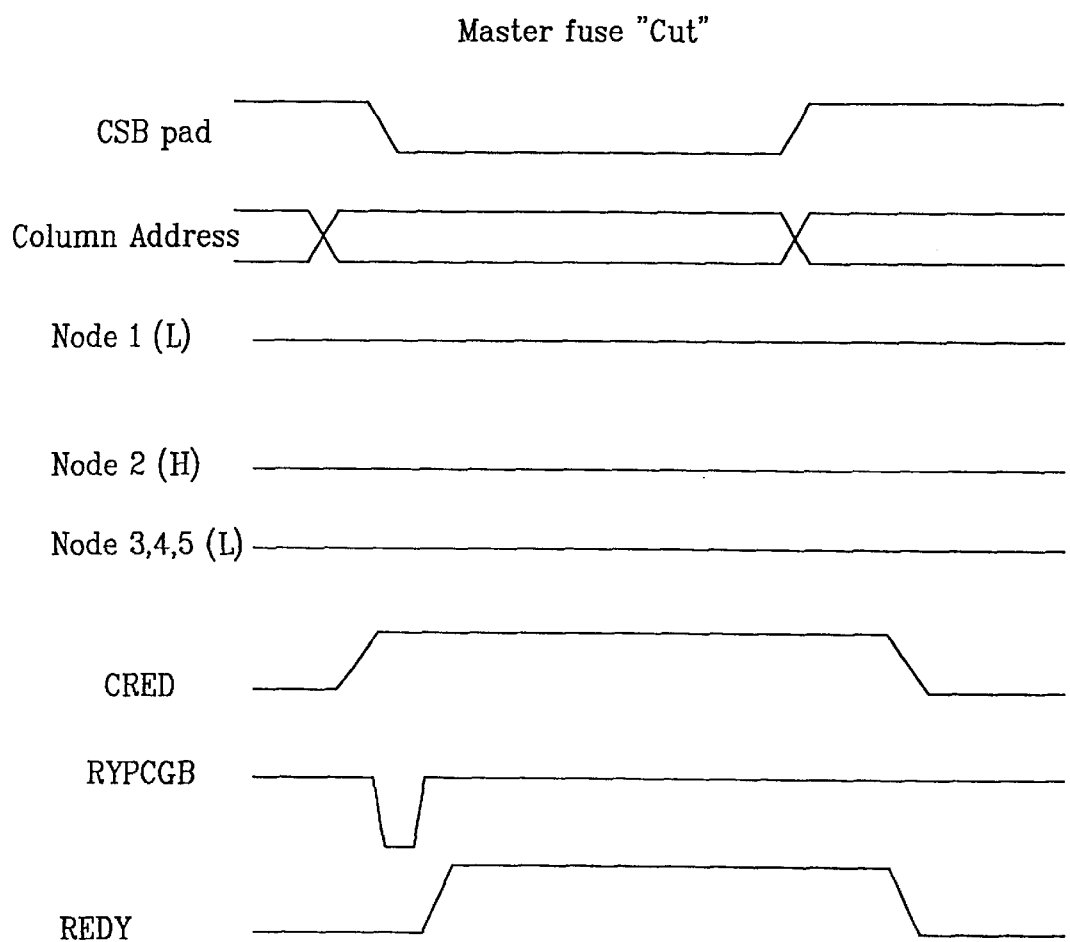
FIG. 11 illustrates an exemplary timing diagram when repair is performed according to the present invention.

FIG. 11 illustrates an exemplary timing diagram when repair is performed according to the present invention. In FIG. 11, the master fuse MF is severed, and the fuse connected to the NMOS transistor in the same pair with the NMOS transistor that receives a failed column address signal having an opposite phase. Then the fuse connected to the NMOS transistor that receives an address signal of no failure is severed, and the fuse of the NMOS transistor in the same pair with the above NMOS transistor having an opposite phase is not severed. For an example, it is assumed that there are failures at locations of y<4>, y<3>, y<2>, y<1>, y<0>, and z<3>, z<2>, z<1>, z<0>, whereby fuses for y<4>, y<3>, y<2>, y<1>, y<0> may not be severed, but fuses for yb<4>, yb<3>, yb<2>, yb<1>, yb<0> may be severed. With regard to 'z' addresses, in the same method as the 'y' addresses, fuses for z<3>, z<2>, z<1>, and z<0> should not be severed, but fuses for zb<3>, zb<2>, zb<1>, and zb<0> should be severed.

Accordingly, if a circuit operation is enabled as the redundancy control signal CED is held at a high level H while the chip enable signal CSBpad is held at a low level L, then nodes 1 and 2 are held at a low level L, and a high level H respectively. Moreover, the node 3 transits to a low level L by the high level H of the node 2, thereby making the nodes 3, 4, and 5 conductive to one another by the failed address that, in turn, makes the nodes 4 and 5 to be at a low level L. The low level L values of the nodes 4 and 5 transit the failed column address enabling signal REDY to a high level H. The fail column address enabling signal REDY from the fail column address fuse box is provided to the input/output coding fuse box corresponding to the failed column address fuse box, and the repair column adjusting circuit part 73.

Figure 12:
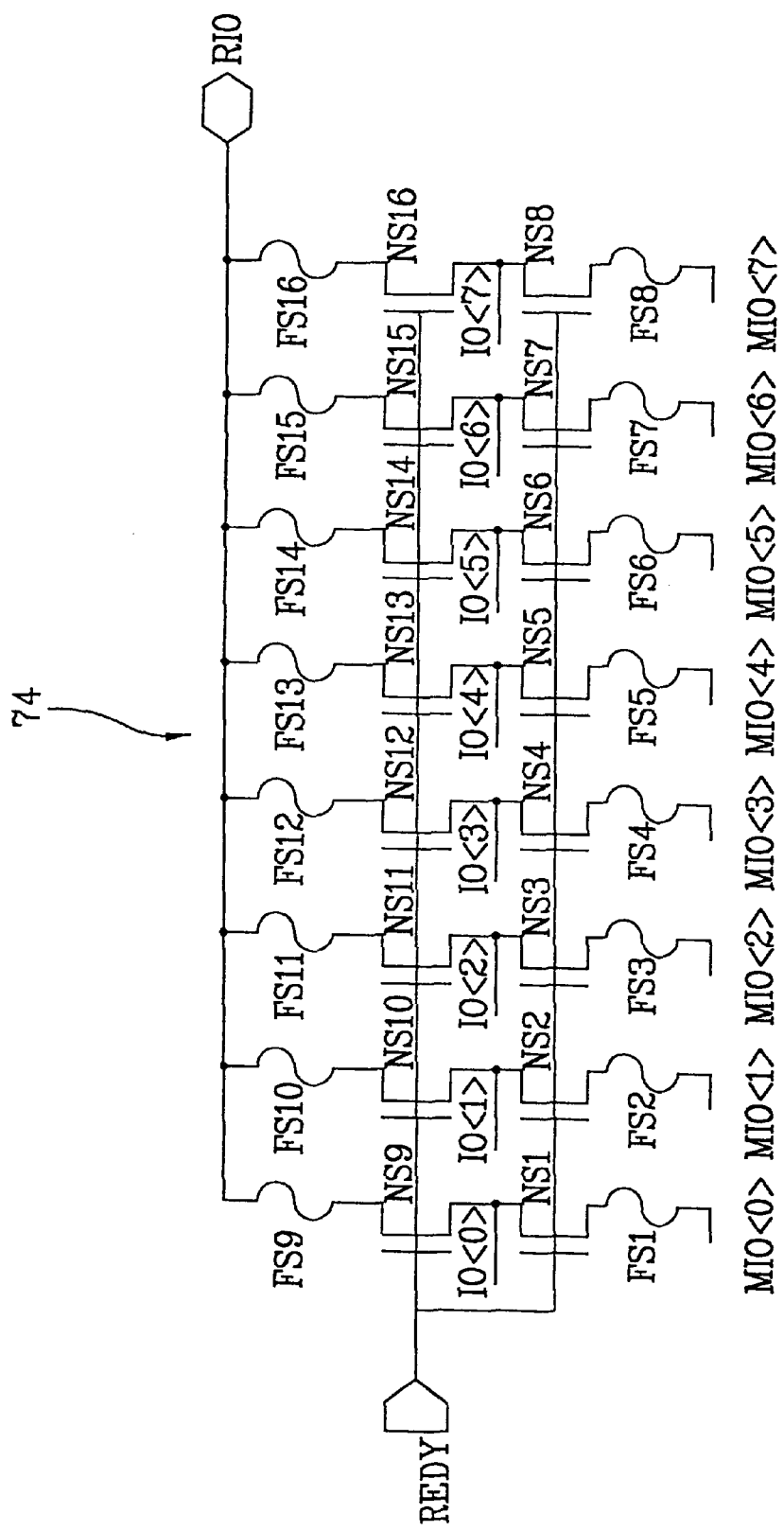
FIG. 12 illustrates a detail of a fail input/output coding fuse box according to the present invention.

FIG. 12 illustrates a detail of a fail input/output coding fuse box according to the present invention. In FIG. 12, the fail input/output coding fuse box includes NMOS transistors NS1 to NS16, and corresponding fuses FS1 to FS16. Gate terminals of the NMOS transistors NS1 to NS16 have the fail column address enabling signal REDY applied thereto. The NMOS transistors NS1 to NS8 have one end connected to input/output lines IO of the data input/output buffer part 74 respectively, and another end connected to the main input/output lines MIO connected to the data bus amplifying blocks 70a, 70b, . . . , 70n, respectively, through the fuses FS1 to FS8. On the other hand, the NMOS transistors NS9 to NS16 have one end connected to input/output lines IO of the data input/output buffer part 74, respectively, and another ends connected to the redundancy input/output lines RIO connected to the redundancy data bus amplifying blocks enabled through the fuses FS9 to FS16.

FS1, NS1, NS9, and FS9 are connected in series with an IO<0> provided between NS1 and NS9 and correspond to MIO<0>. Likewise, FS2, NS2, NS10, and FS10 are interconnected with an IO<1> and correspond to MIO<1>; FS3, NS3, NS11, and FS11 are interconnected with an IO<2> and correspond to MIO<2>; FS4, NS4, NS12, and FS12 are interconnected with an IO<3> and correspond to MIO<3>; FS5, NS5, NS 13, and FS 13 are interconnected with IO<4> and correspond to MIO<4>; FS6, NS6, NS14, and FS14 are interconnected with an IO<5> and correspond to MIO<5>; FS7, NS7, NS15, and FS15 are interconnected with an IO<6> and correspond to MIO<6>; and FS8, NS8, NS16, and FS16 are interconnected with an IO<7> and correspond to MIO<7>, which are all connected in series between the redundancy input/output line RIO and corresponding main input/output lines MIO<0> to MIO<7>.

In the fail input/output coding fuse box, when the failed column address enabling signal REDY is an "H" level, the NMOS transistors NS1 to NS16 are turned ON, and only one of the fuses in series is severed. For example, if FS1 is severed, FS9 is not severed, connecting an input/output line IO<0> of the data input/output buffer part 74 to the redundancy input/output line RIO.

Figure 13:
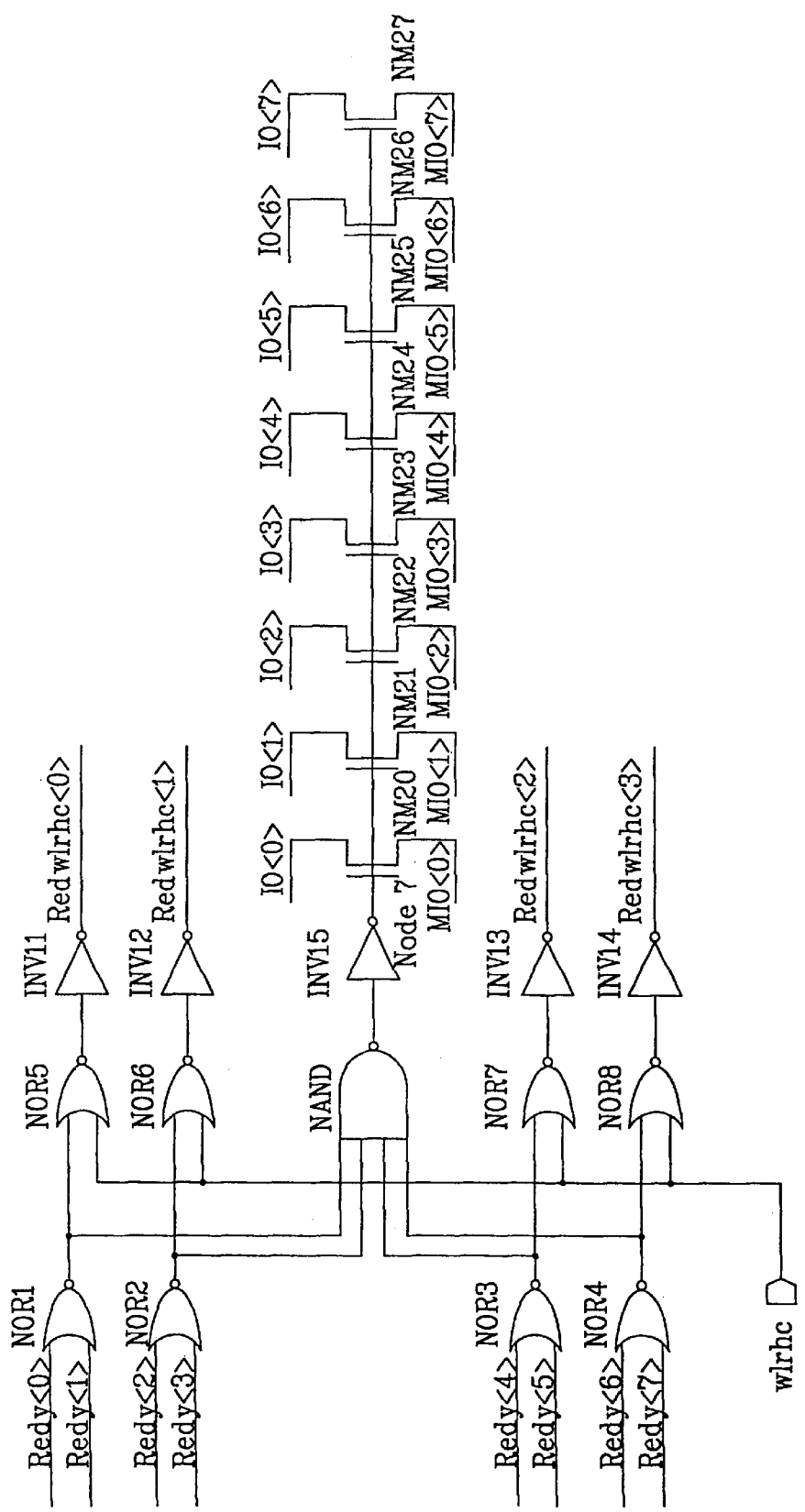
FIG. 13 illustrates a portion of a repair column adjusting circuit according to the present invention.

FIG. 13 illustrates a detailed portion of a repair column adjusting circuit part 73 (in FIG. 7). In FIG. 13, the repair column adjusting circuit part 73 may include NOR gates NOR1 to NOR8, an NAND gate NAND, inverters INV11 to INV15, and NMOS transistors NM20 to NM27. Each of the NOR gates NOR1 to NOR4 may include two failed column address enabling signals REDY applied thereto from a failed column coding fuse block in the failed column coding part 72 in succession. Moreover, the NOR gate NOR1 receives REDY<0> and REDY<1>; the NOR gate NOR2 receives REDY<2> and REDY<3>; the NOR gate NOR3 receives REDY<4> and REDY<5>; and the NOR gate NOR4 receives REDY<6> and REDY<7>, and are subject to logical sum, and inversion, and forward operations.

The NOR gates NOR5 to NOR8 subject output signals of the NOR gates NOR1 to NOR4 and a mode control signal wlrhc to logical sum, and inversion operations. Moreover, the NOR gate NOR5 subjects an output signal of the NOR gate NOR1 and the mode control signal wlrhc to logical sum, and inversion operations, and the NOR gates NOR6 to NOR8 are also subject outputs of the NOR gates NOR2 to NOR4 and the mode control signal wlrhc to a logical sum operation.

The inverters INV11 to INV14 invert output signals of the NOR gates NOR5 to NOR8, respectively, to provide redundancy mode control signals Redwlrhc for controlling read/write operation of the redundancy data bus amplifying blocks in the redundancy data bus amplifying part 71. The NAND gate NAND subjects output signals of the NOR gates NOR1 to NOR4 to logical sum and inversion operations. The inverter INV15 inverts an output signal of the NAND gate NAND, and provides the output signal of the NAND gate NAND to a node 7, and to gates of the NMOS transistors NM20 to NM27. The NMOS transistors NM20 to NM27 have one end connected the main input/output lines MIO connected to the data bus amplifying part 70, and another end connected to the input/output lines IO of the data input/output buffer part 74.

When no repair is performed, since the failed column address enabling signals REDY transit to low level L states, the redundancy mode control signal Redwlrhc, and a node 7 signal transits to a high H state. Thus, the NMOS transistors NM20 to NM27 are turned ON, and connect the main input/output line MIO with the input/output line IO of the data input/output buffer part 74 (in FIG. 7). Accordingly, a signal from the data input/output buffer part 74 is transmitted to a memory cell through the input/output line IO of the data input buffer part and the main input/output line MIO in a write mode, and a data from the memory cell to the data input/output buffer part 74 through the main input/output line MIO and the input/output line IO of the data input/output buffer part in a reading mode.

In FIG. 7, the data bus amplifying part 70 may include a plurality of data bus amplifying blocks 70a to 70n, each for regular data input/output. The redundancy data bus amplifying part 71 may include a plurality of redundancy data bus amplifying blocks 71a to 71m, for using one of the redundancy data bus amplifying blocks in the redundancy data bus amplifying part 71 instead of the data bus amplifying block of a failed column when a column fail occurs.

Figure 14A:
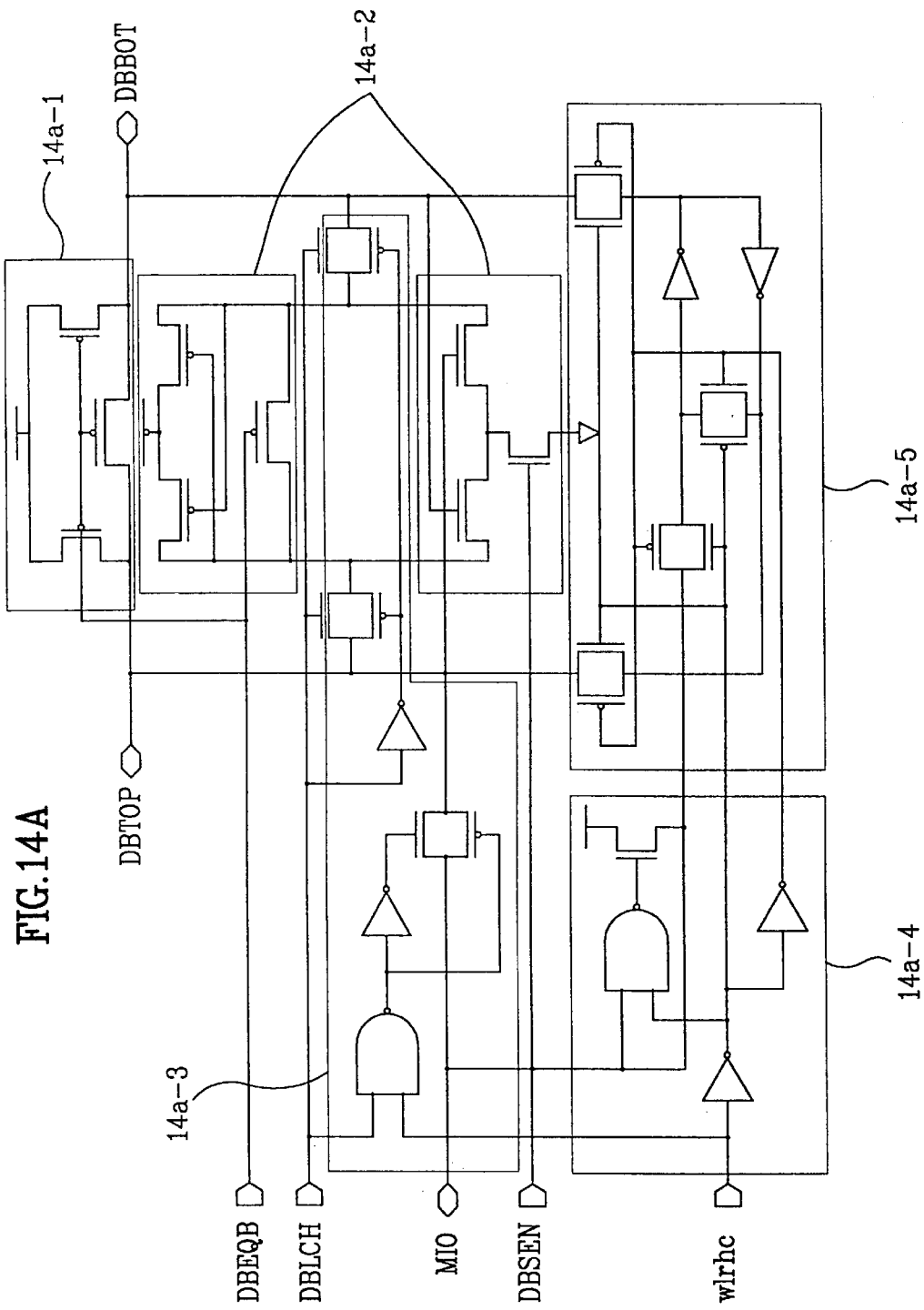
FIG. 14A illustrates a portion of a data bus amplifying block according to the present invention.

FIG. 14A illustrates a portion of a data bus amplifying block according to the present invention. In FIG. 14A, each of the data bus blocks in the data bus amplifying part 70 (in FIG. 7) uses an equalizing control signal DBEQB, a latch enable control signal DBLCH, an amplification enabling signal DBSEN, and a mode control signal wlrhc for making smooth data transfer between the main input/output lines MIO and the data bus lines DBTOP or DBBOT connected to top or bottom cell arrays.

Figure 14B:
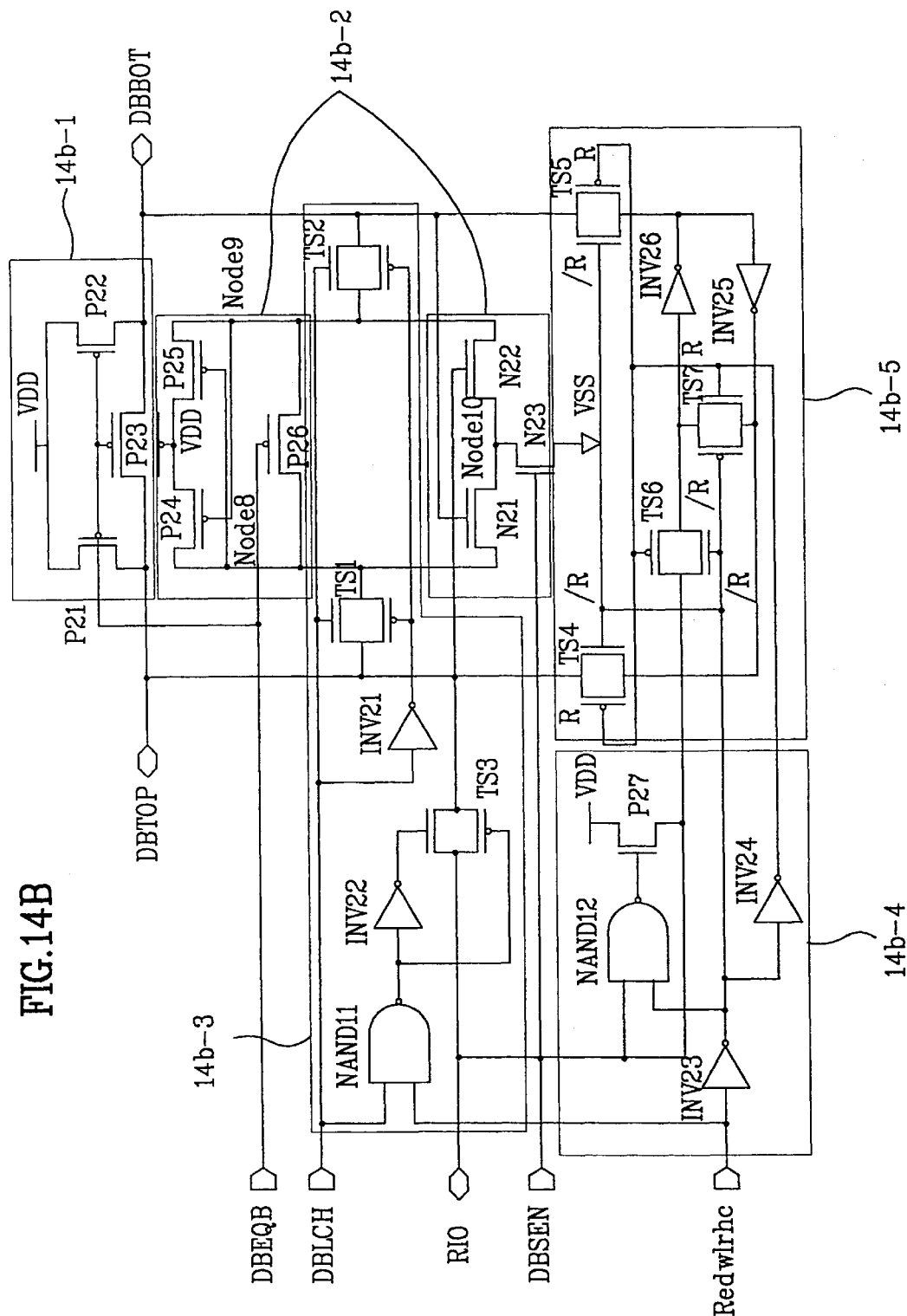
FIG. 14B illustrates a portion of a redundancy data bus amplifying block according to the present invention.

FIG. 14B illustrates a portion of a redundancy data bus amplifying block according to the present invention. In FIG. 14B, the redundancy data bus amplifying block uses a circuit identical to the data bus amplifying block, and uses the equalizing control signal DBEQB, the latch enable control signal DBLCH, and the amplification enabling signal DBSEN as control signals for making smooth data transfer between the redundancy input/output lines RIO, or the top and bottom data bus lines DBTOP and DBBOT. Moreover, the redundancy data bus amplifying block uses control signals almost identical to the data bus amplifying block, except that, different from the data bus amplifying block, the redundancy data bus amplifying block uses the redundancy mode control signal Redwlrhc from the column redundancy adjusting circuit part 73 (in FIG. 7) instead of the mode control signal wlrhc. Since the data bus amplifying block in FIG. 14A and the redundancy data bus amplifying block in FIG. 14B have the same system, for convenience of explanation, only the redundancy data bus amplifying block will be explained.

The redundancy data bus amplifying block uses the equalizing control signal DBEQB, the latch enable control signal DBLCH, the amplification enabling signal DBSEN, and the redundant mode control signal Redwlrhc as control signals, for receiving/forwarding the data bus signal DBTOP connected to the redundancy input/output line RIO and the top cell, and the data bus signal DBBOT connected to the bottom cell. Moreover, the redundancy data bus amplifying block includes an equalize/precharge control part 14b-1, a data bus amplifying circuit part 14b-2, a read mode control part 14b-3, a mode control signal receiving part 14b-4, and a write mode control part 14b-5.

The equalize/precharge control part 14b-1 includes a PMOS transistor P21 having one end connected to VDD, another end connected to a data bus DBTOP of a top cell, and a gate terminal having the equalizing control signal DBEQB applied thereto; a PMOS transistor P22 having one end connected to VDD, another end connected to a data bus DBBOT of the bottom cell, and a gate terminal having the equalizing control signal DBEQB applied thereto; and a PMOS transistor P23 having one end connected to the data bus DBTOP of the top cell, and another end connected to the data bus DBBOT of the bottom cell for equalizing the data bus DBTOP of the top cell, and the data bus DBBOT of the bottom cell according to the equalizing control signal DBEQB applied to a gate terminal thereof.

The data bus amplifying circuit part 14b-2 includes a PMOS transistor P24 having one end connected to VDD and another end connected to a node 8; a PMOS transistor P25 having one end connected to VDD, another end connected to the node 9, and a gate terminal connected to the node 8; and a PMOS transistor P26 having one end connected to the node 8 and another end connected to the node 9 for equalizing the nodes 8 and 9 according to the equalizing control signal applied to a gate terminal thereof. A gate terminal of the PMOS transistor P24 is connected to the node 9. The data bus amplifying circuit part 14b-2 also includes NMOS N21 and N22 connected in series between the nodes 8 and 9, having gate terminals connected to the data bus DBTOP of the top cell, and the data bus DBBOT of the bottom cell respectively, and an NMOS transistor N23 connected between a node 10, a terminal connecting the NMOS transistor N21 and the NMOS transistor N22, and a ground terminal GND, and having a gate terminal for receiving the amplification enabling signal DBSEN.

The read mode control part 14b-3 includes an inverter INV21 for inverting the latch enable control signal DBLCH, transfer gates TS1 and TS2 that are enabled according to the latch enable control signal DBLCH and an output of the inverter INV21, and connecting the nodes 8 and 9 to the data bus DBTOP of the top cell, and the data bus DBBOT of the bottom cell respectively; a NAND gate NAND 11 for subjecting the latch enable control signal DBLCH and the redundancy mode control signal Redwlrhc to logical production and inversion, an inverter INV22 for inverting an output of the NAND gate NAND 11; and a transfer gate TS3 for connecting a redundancy input/output line connected to the redundancy data bus amplifying block enabled in response to an output signals of the inverter INV22 and the NAND gate NAND 11 and the data bus DBTOP of the top cell.

The mode control signal receiving part 14b-4 includes an inverter INV23 for inverting the redundancy mode control signal Redwlrhc, a NAND gate NAND 12 for subjecting an output signal of the inverter INV23, and a signal on the redundancy input/output line RIO to logical production and inversion; a PMOS transistor P27 having one end connected to VDD, another end connected to the redundancy input/output line RIO, and a gate terminal with an output signal of the NAND gate NAND12 applied thereto; and an inverter INV24 for inverting an output signal of the inverter INV23.

The write mode control part 14b-5 includes transfer gates TS4 and TS5 each to be enabled in response to an output signal of the inverter INV23 or INV24 for connecting one end to either node 8 or 9 to another end; an inverter INV25 for inverting a signal from the other end of the transfer gate TS5, and for providing to the other end of the transfer gate TS4 and a transfer gate TS7; and a transfer gate TS7 for being enabled in response to an output signals of the inverter INV23, and the inverter INV24, to connect the redundancy input/output terminal RIO connected to one end thereof to the other end, and an output of the inverter INV25 applied to one end thereof to the other end, respectively.

The transfer gate TS1, and the transfer gate TS2 are enabled/disabled in response to the latch enable control signal DBLCH, and an output signal of the inverter INV21 on the same time, and the transfer gates TS4, TS5, and TS6 are enabled/disabled in response to output signals of the inverters INV23 and INV24 at the same time. On the other hand, the transfer gate TS7 is enabled in a case the transfer gates TS4, TS5, and TS6 are disabled, and disabled in a case the transfer gates TS4, TS5, and TS6 are enabled.

As has been explained, the redundancy data bus amplifying part 71 includes a plurality of, for an example, 'm' redundancy data bus amplifying blocks 71a to 71m having the same system for receiving redundancy mode control signals Redwlrhc<0>, Redwlrhc<1>, Redwlrhc<3>, . . . , Redwlrhc<m>, to amplify signals of the redundancy data buses, respectively.

Figure 15:
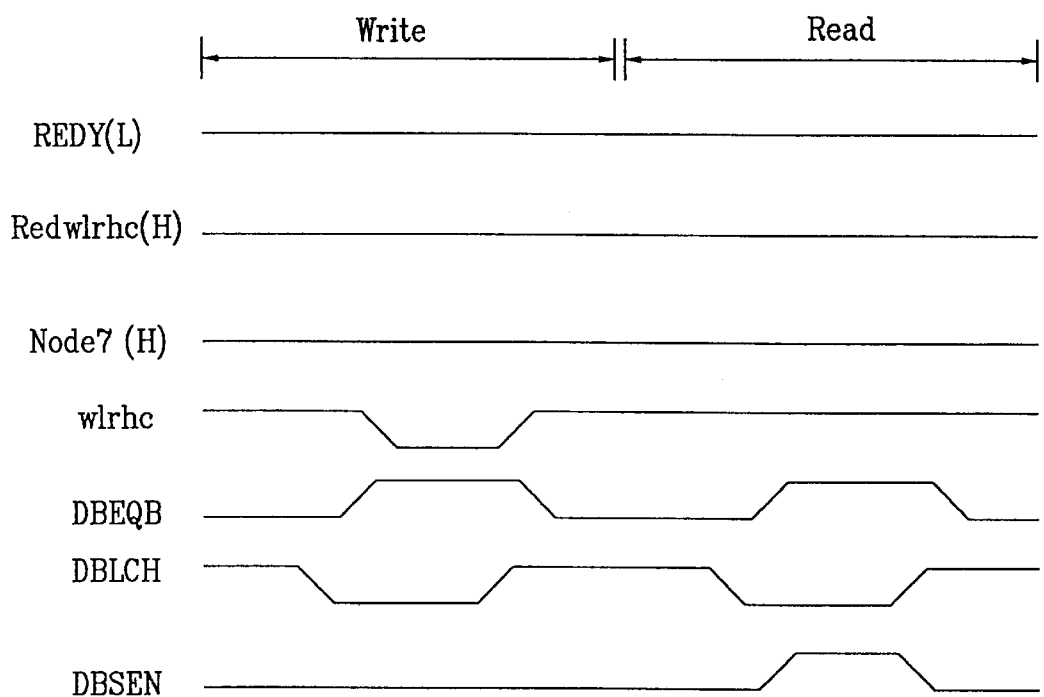
FIG. 15 illustrates an exemplary timing diagram when no repair operation is performed according to the present invention; and, FIG. 16 illustrates a timing diagram when repair operation is performed according to the present invention.
Figure 16:
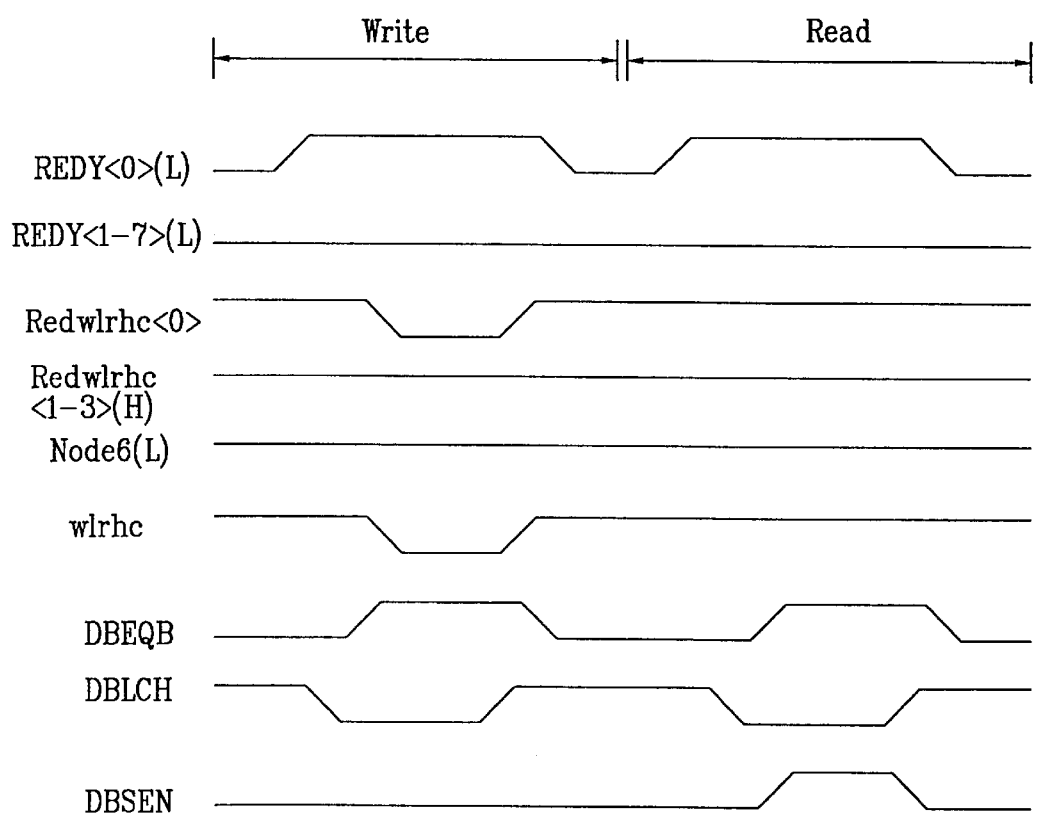

FIGS. 15, and 16 illustrate exemplary control signals used for making smooth transfer of data between the main input/output lines MIO, or redundancy input/output lines RIO, and data buses DBTOP of a top cell, and data buses DBBOT of the bottom cell, and timing diagram of the control signals. In FIG. 15, when no repair is performed, the failed column address enabling signal REDY is at a low level L, and the redundant enabling signal Redwlrhc signal is held at a high level H by the low L value of the failed column address enabling signal REDY. According to this, the node 7 transits to a high level H, leading an input data to the data bus amplifying block through the input/output terminals IO connected to the data input/output buffer part 74, and the main input/output terminals MIO in writing, and leading a data provided to the top, and bottom cell data buses DBTOP, and DBBOT to the main input/output terminals MIO and the input/output terminals IO of the data input/output buffer part 74, and therefrom to the data input/output buffer part 74.

On the other hand, when a repair is performed, for an example, when a defect is detected at IO<0> as shown in FIG. 16, the REDY<0> transits to a high level H, and the REDY<1-7> transits to a low level L. In the repair column adjusting circuit part 73, the Redwlrhc<0> transits to a low level L, the Redwlrhc<1-3> is held at a high level H, and the node 7 transits to a low level L in response to the high level H of the REDY<0>, and the low level L of the REDY<1>. In the fail input/output coding fuse box 72i-2, the fuse FS1 is severed, and the fuse FS9 is not severed, to disconnect the IO<0> from MIO<0>, and connect the IO<0> to RIO. Accordingly, the redundancy input/output line RIO connected to the IO<0> is connected to one selected from the four redundancy data bus amplifying blocks in the redundancy data bus amplifying part 70. Thus, by means of the rest seven data bus amplifying blocks excluding the data bus amplifying block connected to the IO<0> having the defect occurred therein, and the redundancy data bus amplifying block, x8 data input/output is made possible.

As has been explained, the column repair circuit in a non-volatile ferroelectric memory has the following advantages. First, the provision of a repair circuit, not for every memory cell, but one repair circuit for all memory cells reduces an area occupied by the repair circuit, that improves the device packing density. Second, the application of a repair algorithm to all memory cells at a time improves an efficiency of a repair operation, and permits to shorten a fuse cutting time period in the repairing.

It will be apparent to those skilled in the art that various modifications and variations can be made in the column repair circuit in a non-volatile ferroelectric memory of the present invention without departing from the spirit or scope of the invention. Thus, it is intended that the present invention cover the modifications and variations of this invention provided they come within the scope of the appended claims and their equivalents.

What is claimed is:

1. A column repair circuit in a non-volatile ferroelectric memory having main columns and redundancy columns, comprising:

a data input/output buffer part for data input/output between the non-volatile ferroelectric memory and an external circuit;

a failed column coding part for controlling the main columns and the redundancy columns and connected in response to a failed column address signal to one of main input/output lines in the input/output buffer part and redundancy input/output lines;

a repair column adjusting circuit part including a plurality of logical circuits and a plurality of switch blocks, wherein the plurality of logical circuits providing a plurality of redundancy mode control signals in response to a plurality of failed column address enabling signals and a mode control signal, and the plurality of switch blocks selectively connecting a main input/output line and an input/output line of the data input/output buffer part;

a data bus amplifying part for amplifying data between the main input/output lines and the main columns to control read/write operation; and a redundancy data bus amplifying part for amplifying data between the redundancy input/output lines and the redundancy columns in response to the redundancy mode control signal.

2. The column repair circuit according to claim 1, wherein the failed column coding part includes a failed column address fuse box for providing a failed column address enabling signal in response to reception of a failed column address, and an input/output coding fuse box forming a pair with the failed column address fuse box for controlling connection in response to the failed columns address enabling signal to one of the main input/output line and the redundancy input/output line.

3. The column repair circuit according to claim 2, wherein the failed column address fuse box includes:
- a repair enabling signal control part that is enabled by a chip enable signal and provides a control signal for controlling repair operation;
- an address fuse cut coding block part having a plurality of address fuse cut coding blocks for severing a fuse for coding a failed address in response to the control signal;
- an address providing part having reset means for initializing output values of the address fuse cut coding blocks in response to the chip enable signal, and pull-up means for pulling up initialized values of the address fuse cut coding blocks; and
- an address sensing part for subjecting signals from the address providing part to logical operation to present a fail column address enabling signal, and for feeding the failed column address enabling signal back to the reset means in the address providing part.

4. The column repair circuit according to claim 3, wherein the address fuse cut coding block part includes a plurality of unit address fuse cut coding blocks each for receiving an 'n' number bit column address signal.

5. The column repair circuit according to claim 4, wherein the unit address fuse cut coding block includes 'n' number of pairs each having $1^{th}$ and $2^{nd}$ NMOS transistors with opposite phases connected in series with $1^{th}$ and $2^{nd}$ fuses, respectively, with ends of adjacent pairs connected to each other.

6. The column repair circuit according to claim 3, wherein the repair enabling signal control part includes:
- a master fuse having a first end connected to a DC driving voltage for being severed upon occurrence of a column failure;
- an MOS capacitor and a first NMOS transistor connected in parallel between the master fuse and a ground terminal;
- a first inverter for inverting a signal from a second end of the master fuse, and for providing the inverted signal to a gate electrode of the first NMOS transistor;
- a first PMOS transistor having a first end connected to a DC driving voltage terminal, a gate electrode for receiving an output signal of the first inverter, and a second end for providing the control signal;
- a second NMOS transistor having a first end connected the second end of the first PMOS transistor, and a gate electrode for receiving an output signal of the first inverter, and
- a third NMOS transistor connected between the second end of the second NMOS transistor and a ground terminal for being selectively enabled according to the chip enable signal.

7. The column repair circuit according to claim 3, wherein the address providing part includes:
- a second PMOS transistor having a gate electrode for receiving the failed column address enabling signal and a first end connected to VDD;
- reset means having third and fourth PMOS transistors connected in parallel between a second end of the second PMOS transistor and an output terminal of the address fuse cut coding block part for being conductive in response to a reset signal applied to gate electrodes in a form of a short pulse during a chip enable time; and
- pull-up means having fifth and sixth PMOS transistors for pulling up initial values of output terminal signals of the address fuse cut coding block parts.

8. The column repair circuit according to claim 3, wherein the address sensing part includes:
- a first NOR gate for subjecting output signals of the address fuse cut coding blocks to logical sum and inversion operations,
- a delay circuit for delaying an output signal of the first NOR gate to provide the failed column address enabling signal, and
- a second inverter for inverting the failed column address enabling signal, and providing the inverter failed column address enabling signal to the address providing part.

9. The column repair circuit according to claim 2, wherein the input/output coding fuse box includes a first address fuse cutting part disposed between input/output terminals of the redundancy data bus amplifying part and data input/output terminals for receiving the failed column address enabling signal, and for cutting an address of a redundancy cell array block, and a second address cutting part disposed between the data input/output buffer part and input/output terminals of the data bus amplifying part for receiving the failed column address enabling signal, and for cutting an address of the main cell array block.

10. The column repair circuit according to claim 9, wherein the first address fuse cutting part includes a plurality of fuses each having a first end connected to input/output terminals of the redundancy data bus amplifying part, and a plurality of NMOS transistors connected in succession between second ends of the fuses and the input/output terminals of the data input/output buffer part.

11. The column repair circuit according to claim 9, wherein the second address fuse cutting part includes a plurality of fuses having first ends connected to input/output terminals of the data bus amplifying part, and a plurality of NMOS transistors connected between second ends of the fuses and input/output terminals of the data input/output buffer part in succession.

12. The column repair circuit according to claim 1, wherein the repair column adjusting circuit part includes:
- a plurality of first logical circuits each for receiving one pair of failed column address enabling signals from the failed address coding fuse boxes, subjecting the failed column address enabling signals to logical sum and inversion operations;
- a plurality of second logical circuits for receiving output signals of the plurality of first logical circuits and mode control signals for controlling read/write modes and subjecting to an output to logical sum operations;
- a third logical circuit for subjecting output signals of the plurality of first logical circuits to logical production operations; and
- a plurality of switch blocks each having a first electrode connected to an input/output line of the data input/output buffer part and a second electrode connected to the main input/output line for selectively connecting the main input/output line and the input/output line of the data input/output buffer part according to an output signal of the third logical circuit.

13. The column repair circuit according to claim 1, wherein each of unit data bus amplifying blocks in the data bus amplifying part includes:
- an equalize/precharge control part for precharging a top cell data bus and a bottom cell data bus to a same level of voltages in response to an equalizing control signal;
- a first data amplifying circuit part having first and second nodes for equalizing by equalizing means enabled in response to the equalizing control signal, and for being enabled by an amplifying enabling signal to amplify a voltage difference of the first, and second nodes;
- a mode control signal receiving part for receiving a mode control signal to control data read/write operation;

a first read mode control part for providing data from the top cell and bottom cell data buses to the first and second nodes in response to a latch enable control signal, and for providing a signal amplified at the first data amplifying circuit part to one of the fail input/output coding fuse box in the failed column coding part and the repair column adjusting circuit part through the main input/output line in a read mode; and a first write mode control part for providing a signal received through the main input/output line to the top cell and bottom cell data buses during a write mode.

14. The column repair circuit according to claim 13, wherein the mode control signal receiving part includes:

a first inverter for inverting the mode control signal;

a second inverter for inverting an output signal of the first inverter;

a first NAND gate for subjecting an output signal of the first inverter and a signal on the main input/output line to logical production and inversion operations; and an NMOS transistor connected between the DC driving voltage and the main input/output line for being selectively turned ON according to an output signal of the NAND gate applied to a gate electrode.

15. The column repair circuit according to claim 13, wherein the first read mode control part includes:

a third inverter for inverting the latch enable control signal;

first and second transfer gates for selectively being turned ON according to the latch enable control signal and an output signal of the third inverter, and for connecting the first node to the data bus of the top cell and the second node to the data bus of the bottom cell;

a second NAND gate for subjecting the latch enable control signal and the mode control signal to logical production and inversion operations;

a fourth inverter for inverting an output signal of the second NAND gate; and a third transfer gate for being selectively turned ON according to an output of the fourth inverter and an output signal of the second NAND gate, to provide a signal on the main input/output line to the first data amplifying circuit part and the top cell data bus.

16. The column repair circuit according to claim 13, wherein the first write mode control part includes:

a fourth transfer gate for being turned ON during a write mode to receive the signal on the main input/output line, a fifth inverter for inverting the signal on the main input/output line received through the fourth transfer gate, a sixth inverter for inverting an output signal of the fifth inverter, fifth and sixth transfer gates for being turned ON during a write mode to provide an output signal of the sixth to the top cell data bus, and an output signal of the fifth inverter to the bottom cell data bus; and a seventh transfer gate for being turned ON during a read mode, to latch an input of the fifth inverter with the input connected with an output of the sixth inverter.

17. The column repair circuit according to claim 13, wherein the mode control signal receiving part includes:

a first inverter for inverting the mode control signal;

a second inverter for inverting an output signal of the first inverter;

a first NAND gate for subjecting an output signal of the first inverter and the signal on the main input/output line to logical production and inversion operations; and an NMOS transistor connected between the DC driving voltage and the main input/output line for being selectively turned ON according to an output signal of the NAND gate applied to a gate electrode.

18. The column repair circuit according to claim 1, wherein each of unit data bus amplifying blocks in the redundancy data bus amplifying part includes:

a second equalize/precharge control part for precharging the top cell data bus and the bottom cell data bus with voltages of a same level in response to an equalizing control signal;

a second data amplifying circuit part having third and fourth nodes for being equalized in response to the equalizing control signal, and being enabled to amplify a voltage difference of the third and fourth nodes;

a redundancy mode control signal receiving part for receiving the redundancy mode control signal, and controlling data read/write operation;

a second read mode control part for respectively providing data from the top cell data bus to the third node and the bottom cell data bus to the fourth node in response to a latch enable control signal, and a signal amplified at the second data amplifying circuit part to one of the failed input/output coding fuse box in the failed column coding part and the repair column adjusting circuit part through the main input/output line during a read mode; and a second write mode control part for providing a signal received through the main input/output line in a write mode to the top cell, and the bottom cell data buses.

19. The column repair circuit according to claim 18, wherein the second read mode control part includes:

a third inverter for inverting the latch enable control signal;

a plurality of first transfer gates for being selectively turned ON according to the latch enable control signal and an output signal of the third inverter, and for connecting the data bus of the top cell to the third node and the data bus of the bottom cell to the fourth node;

a NAND gate for subjecting the latch enable control signal and the redundancy mode control signal to logical production and inversion operations;

a fourth inverter for inverting an output signal of the NAND gate; and a second transfer gate for being selectively turned ON according to an output of the fourth inverter and an output signal of the NAND gate, to provide a signal on the main input/output line to the second data amplifying circuit part and the top cell data bus.

20. The column repair circuit according to claim 18, wherein the second write mode control part includes:

a third transfer gate for being turned ON during a write mode to receive the signal on the main input/output line;

a fifth inverter for inverting the signal on the main input/output line received through the third transfer gate;

a sixth inverter for inverting an output signal of the fifth inverter;

a plurality of fourth transfer gates for being turned ON during a write mode to provide an output signal of the sixth inverter to the top cell data bus and an output of the fifth inverter to the bottom cell data bus; and a fifth transfer gate for being turned ON during a read mode to latch an input of the fifth inverter with the input connected with an output of the sixth inverter.

* * * * *